United States Patent [19]

Ueno

[11] Patent Number: 5,260,908
[45] Date of Patent: Nov. 9, 1993

[54] MULTIPORT MEMORY DEVICE

[75] Inventor: Kiyoji Ueno, Kawasaki, Japan

[73] Assignee: Kabushiki Kaisha Toshiba, Kawasaki, Japan

[21] Appl. No.: 872,312

[22] Filed: Apr. 23, 1992

[30] Foreign Application Priority Data

Apr. 24, 1991 [JP] Japan .................................. 3-94106

[51] Int. Cl.⁵ .................................................. G11C 7/00
[52] U.S. Cl. ............................. 365/230.05; 365/154; 365/189.04; 365/189.05
[58] Field of Search ............ 365/230.05, 230.08, 365/154, 189.04, 189.05

[56] References Cited

U.S. PATENT DOCUMENTS

| | | | |
|---|---|---|---|
| 4,623,990 | 11/1986 | Allen et al. | 365/189 |
| 4,815,038 | 3/1989 | Scharrer et al. | 365/189 |
| 4,833,648 | 5/1989 | Scharrer et al. | 365/230.05 |
| 5,003,509 | 3/1991 | Bosnyak | 365/230.05 |
| 5,023,844 | 6/1991 | Arnold et al. | 365/230.05 |
| 5,189,640 | 2/1993 | Huard | 365/154 |

FOREIGN PATENT DOCUMENTS

| | | | |
|---|---|---|---|
| 60-236187 | 11/1985 | Japan . | |
| 60-236188 | 11/1985 | Japan . | |
| 60-236189 | 11/1985 | Japan . | |
| 62-180582 | 8/1987 | Japan . | |
| 63-197088 | 8/1988 | Japan | 365/154 |

Primary Examiner—Eugene R. LaRoche
Assistant Examiner—Tan Nguyen
Attorney, Agent, or Firm—Finnegan, Henderson, Farabow, Garrett & Dunner

[57] ABSTRACT

A multiport memory device according to this invention comprises a power source, a memory cell for storing data, a first bit line, a first word line, a first switch which has an input section connected to the first word line and a current path whose one end is connected to the first bit line, and which provides on/off control according to the potential of the first word line, a second bit line, a second word line, a second switch which has an input section connected to the second word line and a current path whose one end is connected to the second bit line, and which provides on/off control according to the potential of the second word line. It further comprises a third switch which has an input section connected to the memory cell and a current path whose one end is connected to both the other end of the current path of the first switch and the other end of the current path of the second switch and whose other end is connected to the power source, and which provides on/off control according to the presence/absence of data in the memory cell.

19 Claims, 4 Drawing Sheets

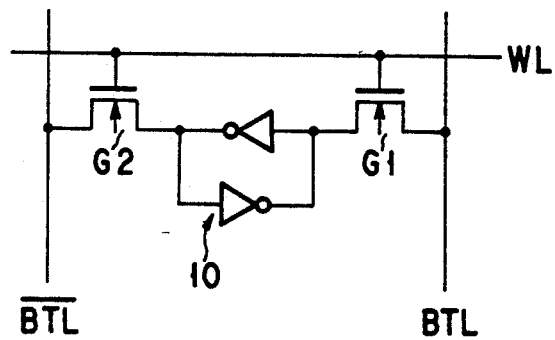
F I G. 1
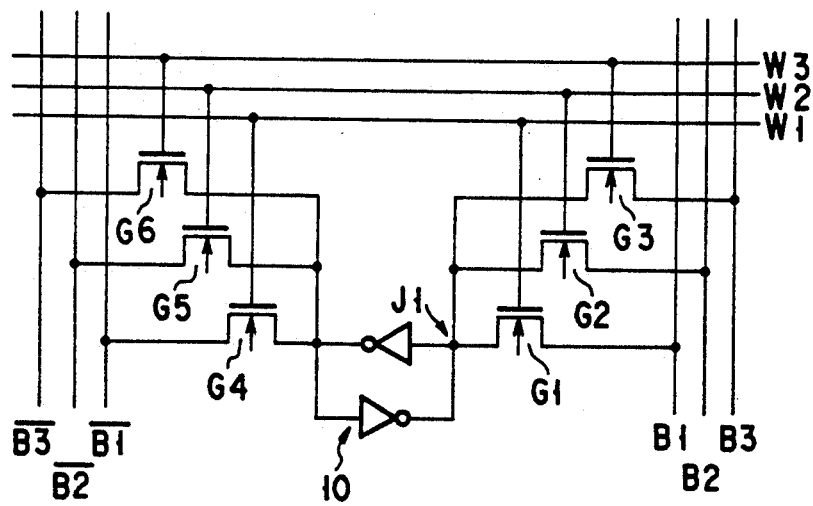
F I G. 2

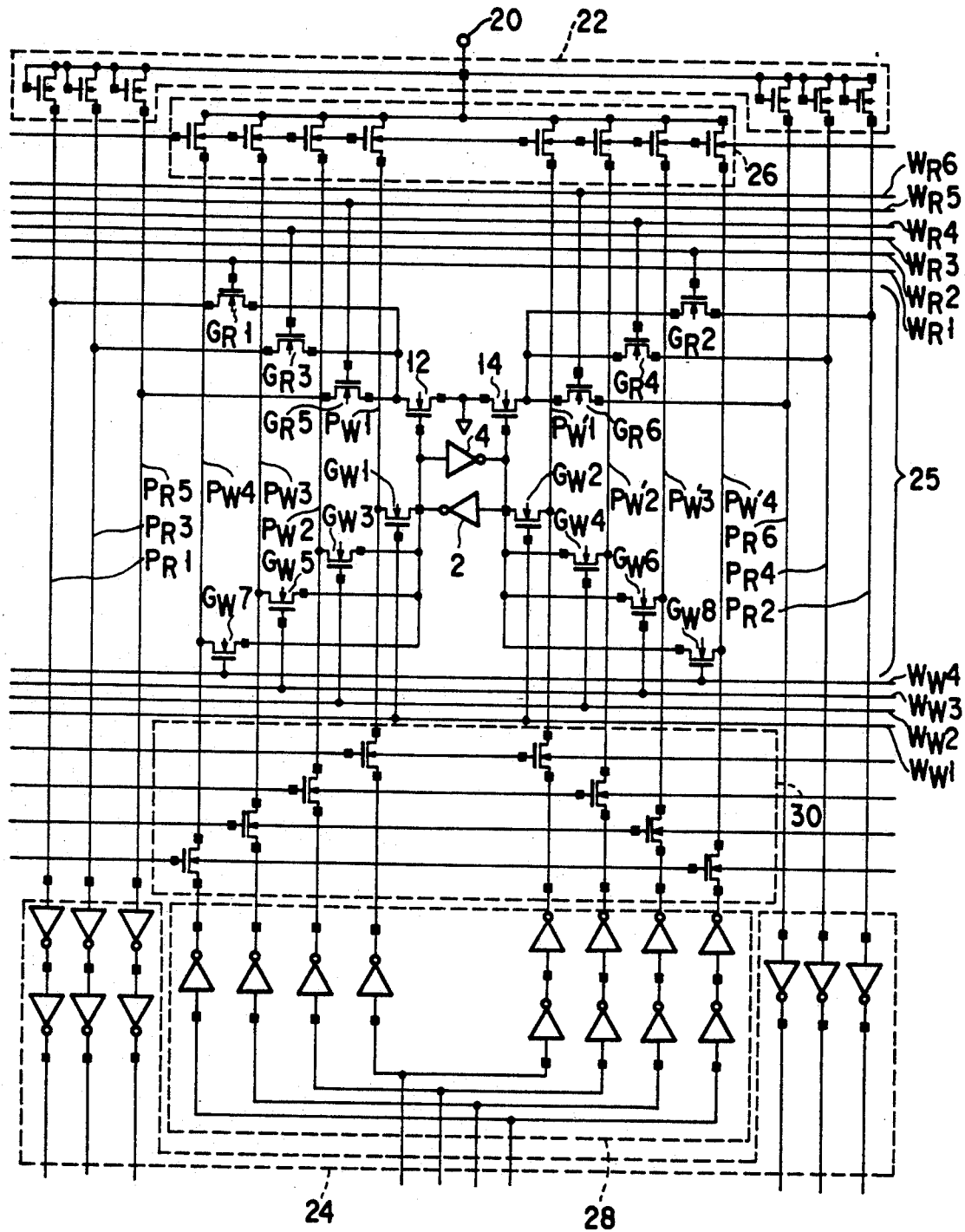
F I G. 4

MULTIPORT MEMORY DEVICE

BACKGROUND OF THE INVENTION

1. Field of the Invention

This invention relates to a multiport memory device, and more particularly to a multiport memory device featuring an improved method of extracting data from the latch circuitry.

2. Description of the Related Art

Recently, there have been strong demands in the field of microprocessors toward higher performance. One way to meet such demands is to speed up calculation by parallel execution. To execute parallel operation at high cost performance requires multiport memory devices.

Multiport memory devices allow a plurality of read ports to read the same or different words of data in parallel, and a plurality of write ports to write the same or different words of data simultaneously.

A read/write single-port static RAM memory cell is shown in FIG. 1, where reference characters G1 and G2 indicate transfer gates, respectively. To read data from and write data into a latch circuit 10, a word line WL is first selected, transfer gate transistors G1 and G2 are turned on and off to electrically connect the latch circuit to bit lines BTL and $\overline{BTL}$, thereby transferring the data in the latch circuit 10 to the bit lines BTL and $\overline{BTL}$. A memory cell of multiport design is shown in FIG. 2 as an extension of this technology. As shown here, a plurality of transfer gate transistors G1 to G6 are each connected to two inverter outputs constituting the latch circuit 10. For reading/writing of data, like the above single-port memory cell, word lines W1 to W3 are selected to turn on and off G1 to G6, thereby electrically connecting the latch circuit 10 to bit lines B1 to B3, and $\overline{B1}$ to $\overline{B3}$.

In the multiport memory, however, when a plurality of ports read the data from a cell at the same time, the potential at the cell becomes unstable seriously. For example, with the potential at node J1 at the high level and the potential of bit lines B1 to B3 at the low level in FIG. 2, when transfer gate transistors G1 to G3 are all turned on by simultaneous selection of word lines W1 to W3, the potential at node J1 drops. A drop in the potential at node J1 can reverse the data in the cell.

As mentioned above, in the multiport memory cell, when data is read out by a plurality of ports, there is a high possibility that the data in the latch circuit may be destroyed.

SUMMARY OF THE INVENTION

Accordingly, the object of the present invention is to provide a multiport memory device capable of reading data without permitting the data in the memory cell to be destroyed, with a minimum increase in the number of elements employed.

The foregoing object is accomplished by providing a multiport memory device comprising: a power source; a memory cell for storing data; a first bit line; a first word line; a first switch which has an input section connected to the first word line and a current path whose one end is connected to the first bit line, and which provides on/off control according to the potential of the first word line; a second bit line; a second word line; a second switch which has an input section connected to the second word line and a current path whose one end is connected to the second bit line, and which provides on/off control according to the potential of the second word line; and a third switch which has an input section connected to the memory cell and a current path whose one end is connected to both the other end of the current path of the first switch and the other end of the current path of the second switch and whose other end is connected to the power source, and which provides on/off control according to the presence/absence of data in the memory cell.

With a multiport memory of this configuration, the data stored in the memory cell is extracted by a third switch that turns on and off depending on the presence/absence of the data, and the extracted data is introduced into a first or a second switch, which in turns transfers it to the bit line. This prevents the data in the memory cell from being affected by variations in the potential or the like, even when the first and second switches turn on simultaneously, thereby avoiding destruction of data stored. Further, commonly using the third switch at a plurality of ports can prevent an increase in the number of elements employed in the multiport memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a single-port static RAM;

FIG. 2 is a circuit diagram of a multiport static RAM;

FIG. 4 is a circuit diagram of a multiport memory device according to a second embodiment of the present invention;

DETAILED DESCRIPTION OF THE PREFERRED EMBODIMENTS

Referring to the accompanying drawings, embodiments of the present invention will be explained.

Figure 3:
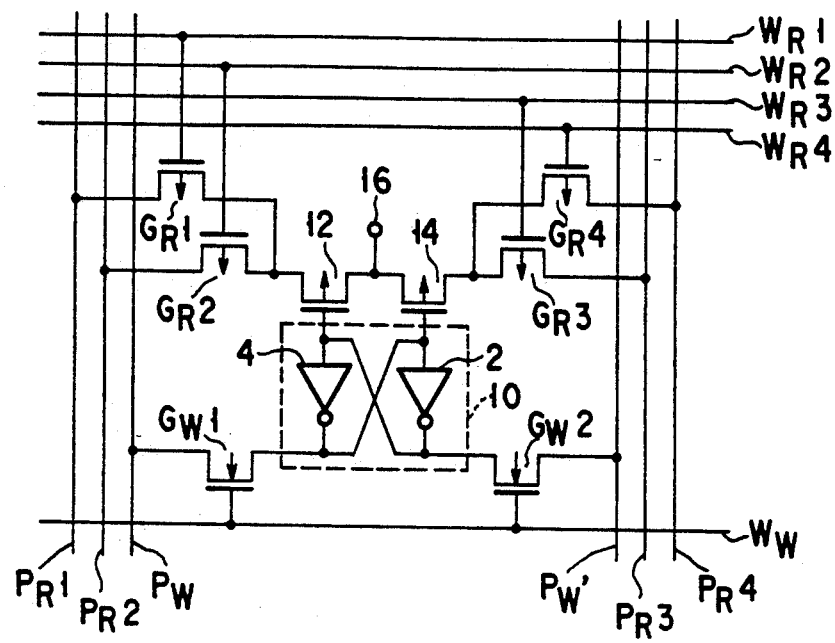
FIG. 3 is a circuit diagram of a multiport memory device according to a first embodiment of the present invention.

As shown in FIG. 3, a latch circuit 10 for storing data is composed of inverters 2 and 4. The output of inverter 2 is connected to the input of inverter 4, while the output of inverter 4 is connected to the input of inverter 2. The output of inverter 2 is connected to the gate of a p-channel transistor 12. The source of transistor 12 is connected to a power supply 16. The drain of transistor 12 is connected to the sources of p-channel transfer gate transistors $G_{R1}$ and $G_{R2}$. The transistor $G_{R1}$ has its gate connected to a data read word line $W_{R1}$ and its drain connected to a data read port $P_{R1}$. The transistor $G_{R2}$ has its gate connected to a data read word line $W_{R2}$ and its drain connected to a data read port $P_{R2}$. The output of inverter 4 is connected to the gate of transistor 14, whose source is connected to the power supply 16. The drain of transistor 14 is connected to both sources of transfer gate transistors $G_{R3}$ and $G_{R4}$. The transistor $G_{R3}$ has its gate connected to a read word line $W_{R3}$ and its drain connected to a read port $P_{R3}$. The transistor $G_{R4}$ has its gate connected to a read word line $W_{R4}$ and its drain connected to a read port $P_{R4}$.

A write word line $W_W$ is provided for writing. The word line $W_W$ is connected to the gates of n-channel transfer gate transistors $G_{W1}$ and $G_{W2}$. The transistor $G_{W1}$ has its source connected to a write port $P_W$ and its drain connected to the output of inverter 4. The transistor $G_{W2}$ has its source connected to a write port $P_W$ and its drain connected to the output of inverter 2.

Both transistors 12 and 14 are turned on and off, based on the data in the latch circuit 10. By turning on and off transistors 12 and 14, the data in latch circuit 10 is transferred to the sources of transistors $G_{R1}$ and $G_{R2}$ and transistors $G_{R3}$ and $G_{R4}$. When at least one of read word lines $W_{R1}$ to $W_{R4}$ is selected, transistors $G_{R1}$ to $G_{R4}$ are turned on to electrically connect bit lines (read ports $P_{R1}$ to $P_{R4}$) to transistor 12 or 14. This allows the data in the latch circuit 10 to be transferred to the bit lines, from which the data is read.

To write data into the latch circuit 10, with the word line $W_W$ selected, transistors $G_{W1}$ and $G_{W2}$ are turned on, which permits the data to be transferred from the port $P_W$ to the latch circuit 10, which in turn latches the data.

FIG. 4 is a circuit diagram of a multiport memory device according to a second embodiment of the present invention. Here, cell peripheral circuitry such as precharging circuits is also illustrated with the aim of presenting an example of the second embodiment in the form closer to practical use.

The second embodiment differs from the first one in that the transistors 12 and 14, which take data out of the latch circuit, and the read transfer gate transistors $G_{R1}$ to $G_{R6}$ are made up of n-channel transistors instead of p-channel transistors, and in that a plurality of write word lines $W_{W1}$ to $W_{W4}$ are provided for multiport writing.

As shown in FIG. 4, read word lines $W_{R1}$ to $W_{R6}$ are connected to the gates of transfer gate transistors $G_{R1}$ to $G_{R6}$, respectively. The drains of transistors $G_{R1}$, $G_{R3}$, and $G_{R5}$ are connected to read ports $P_{R1}$, $P_{R3}$, and $P_{R5}$, respectively. The sources of these transistors $G_{R1}$, $G_{R3}$, and $G_{R5}$ are all connected to the drain of transistor 12. The drains of transistors $G_{R2}$, $G_{R4}$, and $G_{R6}$ are connected to read ports $P_{R2}$, $P_{R4}$, and $P_{R6}$, respectively. The sources of these transistors $G_{R2}$, $G_{R4}$, and $G_{R6}$ are all connected to the drain of transistor 14.

Word lines $W_{W1}$ to $W_{W4}$ are provided for writing. These word lines $W_{W1}$ to $W_{W4}$ are connected to transfer gate transistors $G_{W1}$ to $G_{W8}$ that connect write ports $P_{W1}$ to $P_{W4}$ and $P_{W1}$ and $P_{W4}$ to the latch circuit.

On one side of the read ports $P_{R1}$ to $P_{R6}$, closer to the high-voltage power supply 20, a read precharging circuit section 22 is provided, while on the opposite side, a read amplifying circuit section 24 is provided. The data read from the cell section 25 is amplified by the inverter of the amplifying circuit section 24, and is supplied as an internal circuit signal to the related circuitry (not shown). On one side of write ports $P_{W1}$ to $P_{W4}$, closer to the high-voltage power supply 20, a write precharging circuit section 26 is provided. On the opposite side, a write amplifying circuit section 28 is provided. A write control circuit section 30 is provided between the cell section 25 and the amplifying circuit section 28. The write control circuit section 30 selects a port into which data is to be written.

Figure 5:
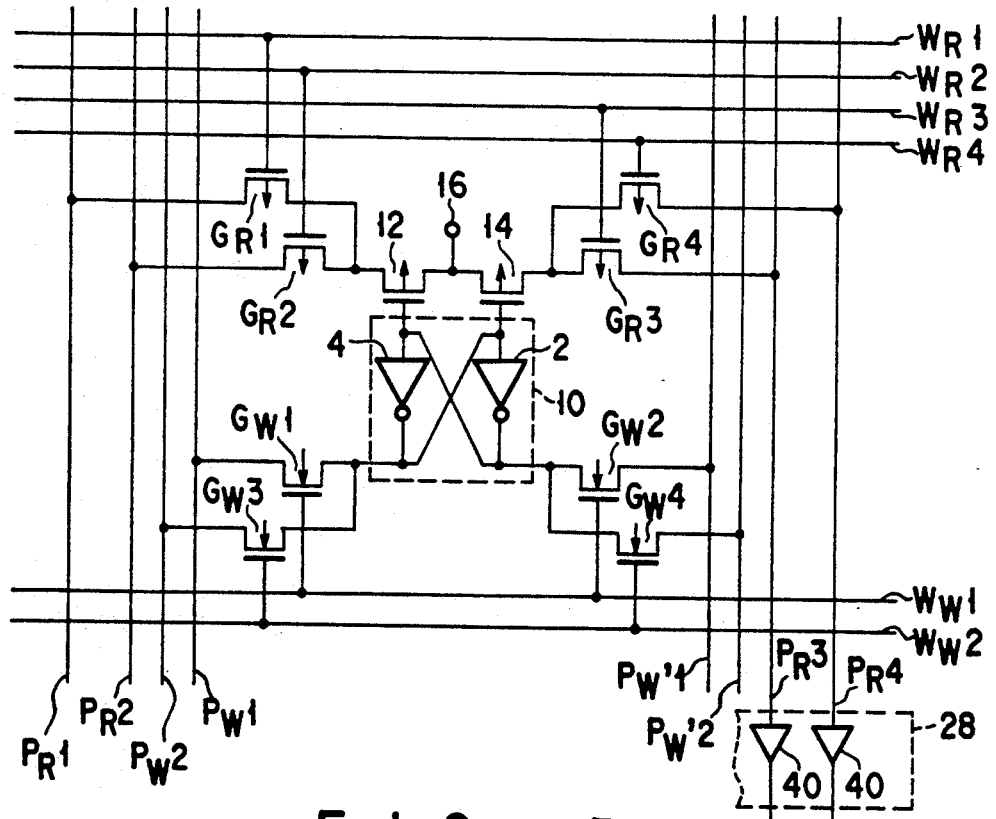
FIG. 5 is a circuit diagram of a multiport memory device according to a third embodiment of the present invention.

FIG. 5 is a circuit diagram of a multiport memory device according to a third embodiment of the present invention.

In the third embodiment, which provides multiport writing like the second embodiment, the transistors 12 and 14 for extracting data, and read transfer gate transistors $G_{R1}$ to $G_{R4}$ are all made up of p-channel transistors.

Figure 6:
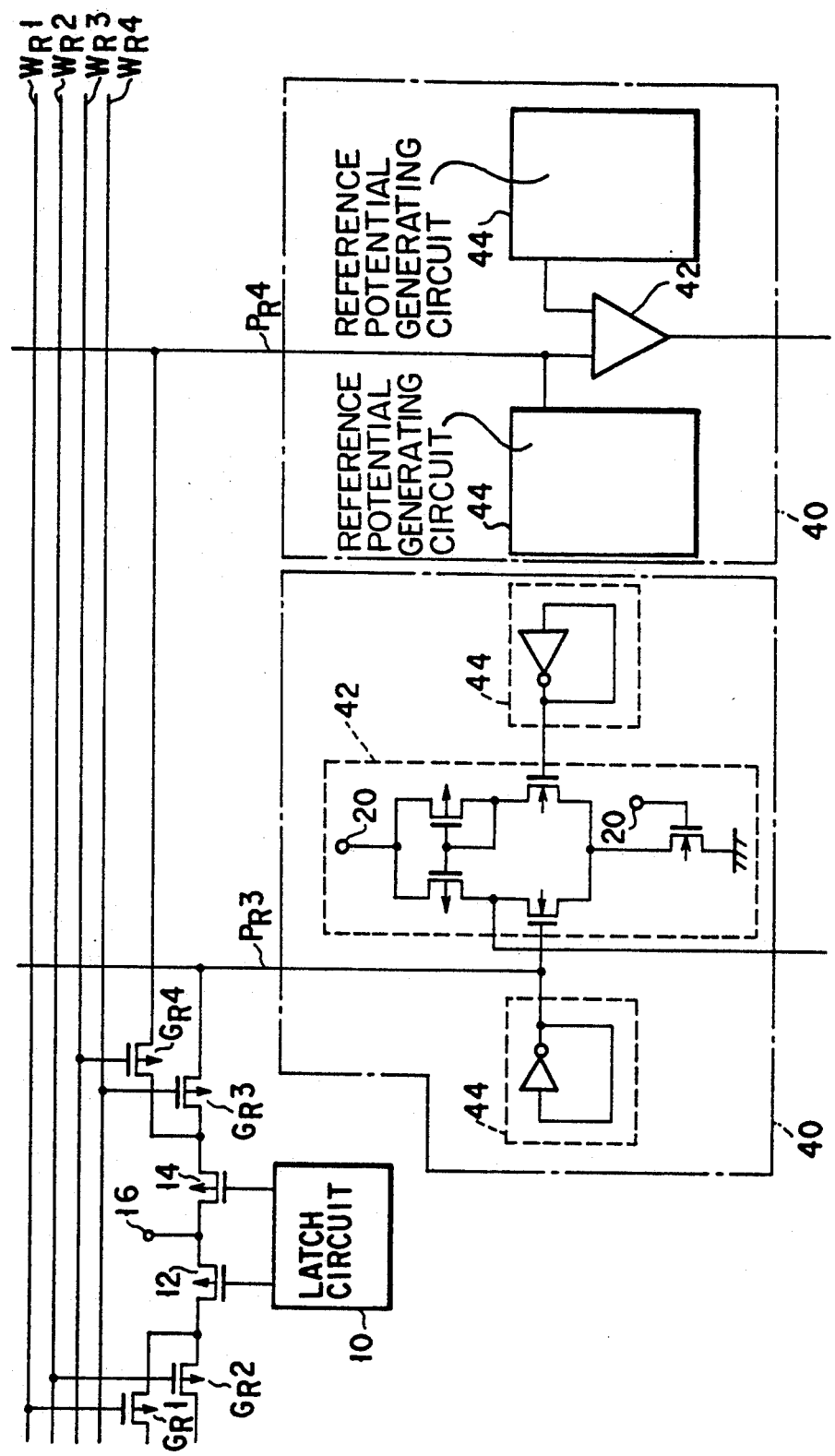
FIG. 6 is a circuit diagram of a differential amplifier for use in a multiport memory device according to the present invention.

In the case of transfer gate transistors $G_{R1}$ to $G_{R4}$ and transistors 12 and 14 being composed of p-channel transistors, the amplifier 40 connected to the read ports may be constructed of a differential amplifier as shown in FIG. 6.

As shown in FIG. 6, the two inputs of the differential amplifier 42 are connected to a reference potential generating circuit 44. The reference potential generation circuit 44 supplies the same potential to each of the two inputs of the differential amplifier 42. One input of the differential amplifier 42 is connected to the read port $P_{R3}$ (or $P_{R4}$). The differential amplifier 42 senses changes in the potential at port $P_{R3}$ (or $P_{R4}$) and produces an amplified signal. In the figure, numerals 16 and 20 indicate high-voltage power supplies.

With the above-described multiport memory devices, data is read via the gates of transistors 12 and 14 that turn on and off based on the data in the latch circuit 10. This prevents the data in the latch circuit 10 from being destroyed even when a single cell is accessed by a plurality of ports to read the data, thereby increasing the stability of the memory cell.

Further, with the present invention, as shown in FIG. 3, Both sources of transfer gate transistors $G_{R1}$ and $G_{R2}$ are connected to the drain of transistor 12. Similarly, both sources of transfer gate transistors $G_{R3}$ and $G_{R4}$ are connected to the drain of transistor 14. This arrangement has the advantage of restraining an increase in the number of elements used in designing multiport memories.

In addition, the present invention may be applied to memory devices with write ports of multiport design or to those with the construction where the transistors extracting data from the latch circuit, and transfer gate transistors are all made up of either p-channel transistors or n-channel transistors, without impairing the effects of the present invention.

As described above, with the present invention, it is possible to provide a multiport memory device capable of reading data without permitting the data in the memory cell to be destroyed. In addition, commonly using the transistor 12 or 14 at a plurality of ports can prevent an increase in the number of elements employed in the multiport memory.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A multiport memory device comprising:

a power source;

a memory cell for storing data;

a first bit line;

a first word line;

a first switch which has an input section connected to said first word line and a current path whose one end is connected to said first bit line, and which provides on/off control according to the potential of said first word line;

a second bit line;

a second word line;

a second switch which has an input section connected to said second word line and a current path whose one end is connected to said second bit line, and which provides on/off control according to the potential of said second word line; and a third switch which has an input section connected to said memory cell and a current path whose one end is connected to both the other end of the current path of said first switch and the other end of the current path of said second switch and whose other end is connected to said power source, and which provides on/off control according to the presence/absence of data in said memory cell.

2. A multiport memory device according to claim 1, wherein said memory cell is a latch circuit constructed in such a manner that the output of a first inverter is connected to the input of a second inverter and the output of said second inverter is connected to the input of said first inverter, with the input section of said third switch being connected to the junction of the output of said first inverter and the input of said second inverter.

3. A multiport memory device according to claim 2, wherein said first switch, said second switch, and said third switch are each made up of insulated-gate FETs.

4. A multiport memory device according to claim 1, further comprising:

a third bit line;

a third word line;

a fourth switch which has an input section connected to said third word line and a current path whose one end is connected to said memory cell and whose other end is connected to said third bit line, and which provides on/off control according to the potential of said third word line.

5. A multiport memory device according to claim 4, wherein:

said first word line and said second word line, when reading the data from said memory cell, are each placed at a potential that turns on at least one of said first switch and said second switch; and said third word line, when writing the data in said memory cell, is placed at a potential that turns on at least said fourth switch.

6. A multiport memory device according to claim 5, wherein said memory cell is a latch circuit constructed in such a manner that the output of a first inverter is connected to the input of a second inverter and the output of said second inverter is connected to the input of said first inverter, with the input section of said third switch being connected to the junction of the output of said first inverter and the input of said second inverter, and one end of the current path of said fourth switch being connected to the junction of the output of said second inverter and the input of said first inverter.

7. A multiport memory device according to claim 6, wherein said first switch, said second switch, said third switch, and said fourth switch are each made up of insulated-gate FETs.

8. A multiport memory device according to claim 4, further comprising:

a fourth bit line;

a fourth word line;

a fifth switch which has an input section connected to said fourth word line and a current path whose one end is connected to one end of the current path of said fourth switch, and whose other end is connected to said fourth bit line, and which provides on/off control according to the potential of said third word line.

9. A multiport memory device according to claim 8, wherein:

said first word line and said second word line, when reading the data from said memory cell, are each placed at a potential that turns on at least one of said first switch and said second switch; and said third word line and said fourth word line, when writing the data in said memory cell, are each placed at a potential that turns on at least one of said fourth switch and said fifth switch.

10. A multiport memory device according to claim 9, wherein said memory cell is a latch circuit constructed in such a manner that the output of a first inverter is connected to the input of a second inverter and the output of said second inverter is connected to the input of said first inverter, with the input section of said third switch being connected to the junction of the output of said first inverter and the input of said second inverter, and one end of the current path of each of said fourth switch and said fifth switch being connected to the junction of the output of said second inverter and the input of said first inverter.

11. A multiport memory device according to claim 10, wherein said first switch, said second switch, said third switch, said fourth switch, and said fifth switch are each made up of insulated-gate FETs.

12. A multiport memory device comprising:

a power source;

a latch circuit constructed in such a manner that the output of a first inverter is connected to the input of a second inverter and the output of said second inverter is connected to the input of said first inverter;

a first bit line;

a first word line;

a first switch which has an input section connected to said first word line and a current path whose one end is connected to said first bit line, and which provides on/off control according to the potential of said first word line;

a second bit line;

a second word line;

a second switch which has an input section connected to said second word line and a current path whose one end is connected to said second bit line, and which provides on/off control according to the potential of said second word line; and a third switch which has an input section connected to a first junction of the output of said first inverter and the input of said second inverter and a current path whose one end is connected to both the other end of the current path of said first switch and the other end of the current path of said second switch and whose other end is connected to said power source, and which provides on/off control according to the potential of said first junction;
a third bit line;
a third word line;
a fourth switch which has an input section connected to said third word line and a current path whose one end is connected to said third bit line, and which provides on/off control according to the potential of said third word line.
a fourth bit line;
a fourth word line;
a fifth switch which has an input section connected to said fourth word line and a current path whose one end is connected to said fourth bit line, and which provides on/off control according to the potential of said fourth word line; and
a sixth switch which has an input section connected to a second junction of the output of said second inverter and the input of said first inverter and a current path whose one end is connected to both the other end of the current path of said fourth switch and the other end of the current path of said fifth switch and whose other end is connected to said power source, and which provides on/off control according to the potential of said second junction.

13. A multiport memory device according to claim 12, wherein said first switch, said second switch, said third switch, said fourth switch, said fifth switch, and said sixth switch are each made up of insulated-gate FETs.

14. A multiport memory device according to claim 12, further comprising:
a fifth bit line;
a fifth word line;
a seventh switch which has an input section connected to said fifth word line and a current path whose one end is connected to a first junction of the output of said first inverter and the input of said second inverter and whose other end is connected to said fifth bit line, and which provides on/off control according to the potential of said fifth word line;
a sixth bit line;
a fifth word line;
an eighth switch which has an input section connected to said sixth word line and a current path whose one end is connected to a second junction of the output of said second inverter and the input of said first inverter and whose other end is connected to said sixth bit line, and which provides on/off control according to the potential of said sixth word line.

15. A multiport memory device according to claim 14, wherein:
said first word line, said second word line, said third word line, and said fourth word line, when reading the data from said latch circuit, are each placed at a potential that turns on at least one of said first switch, said second switch, said third switch, and said fourth switch; and
said fifth word line and said sixth word line, when writing the data in said latch circuit, are each placed at a potential that turns on at least one of said seventh switch and said eighth switch.

16. A multiport memory device according to claim 15, wherein said first switch, said second switch, said third switch, said fourth switch, said fifth switch, said sixth switch, said seventh switch, and said eighth switch are each made up of insulated-gate FETs.

17. A multiport memory device according to claim 14, further comprising:
a seventh bit line;
a seventh word line;
a ninth switch which has an input section connected to said seventh word line and a current path whose one end is connected to said first junction and whose other end is connected to said seventh bit line, and which provides on/off control according to the potential of said seventh word line;
an eighth bit line;
an eighth word line; and
a tenth switch which has an input section connected to said eighth word line and a current path whose one end is connected to said second junction and whose other end is connected to said eighth bit line, and which provides on/off control according to the potential of said eighth word line.

18. A multiport memory device according to claim 17, wherein:
said first word line, said second word line, said third word line, and said fourth word line, when reading the data from said latch circuit, are each placed at a potential that turns on at least one of said first switch, said second switch, said third switch, and said fourth switch; and
said fifth word line, said sixth word line, said seventh word line, and said eighth word line, when writing the data in said latch circuit, are each placed at a potential that turns on at least one of said seventh switch, said eighth switch, said ninth switch, and said tenth switch.

19. A multiport memory device according to claim 18, wherein said first switch, said second switch, said third switch, said fourth switch, said fifth switch, said sixth switch, said seventh switch, said eighth switch, said ninth switch, and said tenth switch are each made up of insulated-gate FETs.

* * * * *